US012258665B2

(12) United States Patent
Choi

(10) Patent No.: US 12,258,665 B2
(45) Date of Patent: Mar. 25, 2025

(54) SUBSTRATE INSPECTION SYSTEM AND A METHOD OF USE THEREOF

(71) Applicant: JNK TECH, San Jose, CA (US)

(72) Inventor: Youngjin Choi, San Jose, CA (US)

(73) Assignee: JNK TECH, San Jose, CA (US)

( * ) Notice: Subject to any disclaimer, the term of this patent is extended or adjusted under 35 U.S.C. 154(b) by 0 days.

(21) Appl. No.: 18/530,033

(22) Filed: Dec. 5, 2023

(65) Prior Publication Data
US 2024/0102169 A1 Mar. 28, 2024

Related U.S. Application Data

(63) Continuation of application No. 17/656,343, filed on Mar. 24, 2022, now Pat. No. 11,840,762, which is a
(Continued)

(51) Int. Cl.
G06K 9/00 (2022.01)
C23C 16/52 (2006.01)
(Continued)

(52) U.S. Cl.
CPC .......... *C23C 16/52* (2013.01); *G01N 21/8851* (2013.01); *G01N 21/9501* (2013.01);
(Continued)

(58) Field of Classification Search
CPC .......... C23C 16/52; G06T 7/13; G06T 7/174; G06T 1/0014; G06T 7/0004;
(Continued)

(56) References Cited

U.S. PATENT DOCUMENTS 6,215,897 B1 * 4/2001 Beer .................. H01L 21/681
348/87
6,324,298 B1 * 11/2001 O'Dell ............... G01N 21/8803
257/E21.53
(Continued)

FOREIGN PATENT DOCUMENTS

KR 10-0165556 B1 2/1999
KR 10-2009-0090938 A 8/2009
(Continued)

OTHER PUBLICATIONS

Chen, Yi-Cheng, Yu-Pin Chen, and Ju-Yi Lee. "Experimental results of a wafer positioning system using machine vision after system calibration." 2012 Proceedings of SICE Annual Conference (SICE). IEEE, 2012. (Year: 2012).*
(Continued)

*Primary Examiner* — Avinash Yentrapati
(74) *Attorney, Agent, or Firm* — Knobbe, Martens, Olson, & Bear, LLP

(57) ABSTRACT

This application relates to a method of inspection and an inspection system for the film deposition process for substrates that includes glass and wafer. The inspection system includes multiple camera modules positioned in a load lock unit of a process chamber, such as the camera modules that can capture images of the substrate in the load lock. The images are analyzed by a control unit of the inspection system to determine the accuracy of robots in handling the substrate, calibration of the robots based on the analysis, and defects in the substrate caused during the handling and deposition process.

3 Claims, 10 Drawing Sheets

Related U.S. Application Data continuation of application No. 17/305,838, filed on Jul. 15, 2021, now Pat. No. 11,286,567, which is a continuation of application No. 17/345,795, filed on Jun. 11, 2021, now Pat. No. 11,987,884.

(60) Provisional application No. 63/175,282, filed on Apr. 15, 2021.

(51) Int. Cl.
| | |
|---|---|
| G01N 21/88 | (2006.01) |
| G01N 21/95 | (2006.01) |
| G01N 21/958 | (2006.01) |
| G06T 1/00 | (2006.01) |
| G06T 7/00 | (2017.01) |
| G06T 7/13 | (2017.01) |
| G06T 7/174 | (2017.01) |
| H01L 21/66 | (2006.01) |
| H01L 21/68 | (2006.01) |

(52) U.S. Cl.
CPC ......... *G01N 21/958* (2013.01); *G06T 1/0014* (2013.01); *G06T 7/0004* (2013.01); *G06T 7/13* (2017.01); *G06T 7/174* (2017.01); *H01L 21/681* (2013.01); *H01L 22/12* (2013.01); *G06T 2207/30148* (2013.01)

(58) Field of Classification Search
CPC .......... G06T 2207/30148; G06T 7/001; G06T 7/0002; G01N 21/8851; G01N 21/958
See application file for complete search history.

(56) References Cited

U.S. PATENT DOCUMENTS

| | | | | |
|---|---|---|---|---|
| 7,634,365 | B2* | 12/2009 | Steele | G01N 27/002 |
| | | | | 702/35 |
| 9,269,923 | B2 | 2/2016 | Choi et al. | |
| 9,449,809 | B2 | 9/2016 | Choi et al. | |
| 10,043,641 | B2 | 8/2018 | Choi et al. | |
| 11,286,567 | B1 | 3/2022 | Choi | |
| 11,508,590 | B2 | 11/2022 | Choi | |
| 11,840,762 | B2 | 12/2023 | Choi | |
| 11,901,202 | B2 | 2/2024 | Choi | |
| 11,987,884 | B2 | 5/2024 | Choi | |
| 2002/0127852 | A1* | 9/2002 | Kawakami | C23C 16/54 |
| | | | | 438/689 |
| 2003/0167612 | A1 | 9/2003 | Kraus et al. | |
| 2005/0031187 | A1* | 2/2005 | Lin | H01L 21/67253 |
| | | | | 382/145 |
| 2005/0045821 | A1* | 3/2005 | Noji | G01N 23/2204 |
| | | | | 250/311 |
| 2008/0144922 | A1* | 6/2008 | Naiki | G03F 9/7088 |
| | | | | 382/145 |
| 2008/0292811 | A1 | 11/2008 | Choi et al. | |
| 2010/0151688 | A1 | 6/2010 | Choi et al. | |
| 2011/0142572 | A1* | 6/2011 | Blonigan | H01J 37/32733 |
| | | | | 414/217 |
| 2011/0188733 | A1* | 8/2011 | Bardos | G01N 21/9501 |
| | | | | 382/149 |
| 2011/0311339 | A1 | 12/2011 | Yasui et al. | |
| 2012/0013899 | A1* | 1/2012 | Amanullah | G03F 7/7065 |
| | | | | 356/237.5 |
| 2012/0112068 | A1* | 5/2012 | Maeda | H01J 37/265 |
| | | | | 250/310 |
| 2014/0264296 | A1* | 9/2014 | Choi | H01L 33/56 |
| | | | | 438/46 |
| 2015/0254827 | A1* | 9/2015 | Kobayashi | G06T 7/001 |
| | | | | 348/130 |
| 2017/0032510 | A1* | 2/2017 | Francken | G06T 7/0004 |
| 2018/0366357 | A1* | 12/2018 | Liao | G06T 7/0008 |
| 2019/0057890 | A1* | 2/2019 | Sato | H01L 21/67265 |
| 2019/0096730 | A1* | 3/2019 | Morita | G06T 7/0004 |
| 2021/0005487 | A1* | 1/2021 | Tsai | C23C 16/45565 |
| 2021/0097675 | A1* | 4/2021 | Koga | G01N 21/8806 |
| 2021/0305074 | A1* | 9/2021 | Wang | G06T 7/0004 |
| 2022/0051380 | A1* | 2/2022 | Jin | G06T 7/00 |
| 2022/0230927 | A1 | 7/2022 | Choi | |
| 2022/0333248 | A1 | 10/2022 | Choi | |
| 2022/0336239 | A1 | 10/2022 | Choi | |
| 2023/0187238 | A1 | 6/2023 | Choi | |
| 2024/0178020 | A1 | 5/2024 | Choi | |

FOREIGN PATENT DOCUMENTS

| | | |
|---|---|---|
| KR | 10-2017-0015209 A | 2/2017 |
| KR | 10-2023-0167765 A | 12/2023 |
| WO | WO 2022/220920 A1 | 10/2022 |

OTHER PUBLICATIONS

Notice of Allowance Mailed on Sep. 27, 2023 for U.S. Appl. No. 17/345,795, 8 page(s).
Notice of Allowance Mailed on Oct. 4, 2023 for U.S. Appl. No. 18/048,164, 7 page(s).
International Search Report in Application No. PCT/US2022/016551 dated May 31, 2022 in 5 pages.
Witten Opinion in Application No. PCT/US2022/016551 dated May 31, 2022 in 7 pages.
Office action in corresponding U.S. Appl. No. 18/048,164 issued on Apr. 13, 2022.
Notice of Allowance dated Oct. 24, 2022 for U.S. Appl. No. 17/647,332.
Office action in corresponding U.S. Appl. No. 17/647,332 issued on Mar. 29, 2022.
Office Action in U.S. Appl. No. 17/305,838 dated Nov. 10, 2021.
Notice of Allowance in U.S. Appl. No. 17/305,838 dated Jan. 24, 2022.
Office Action in U.S. Appl. No. 17/656,343 dated Oct. 14, 2022.
Notice of Allowance dated Jul. 22, 2022 for U.S. Appl. No. 17/647,332.
Notice of Allowance in U.S. Appl. No. 17/656,343 dated Aug. 4, 2023.
Office Action in U.S. Appl. No. 18/435,796 dated Aug. 29, 2024.
Office Action received in Korean Application No. 10-2023-7038632 dated Jan. 31, 2025.

* cited by examiner

| UL | Active | Alarm | Warm | Value | set min | set max | Result | Unit |
|---|---|---|---|---|---|---|---|---|
| X-axis | ☐ | ■ | ☐ | 4.1 | 3.0 | 5.0 | OK | m/m |
| Y-axis | ☐ | ■ | ☐ | 3.8 | 3.0 | 5.0 | OK | m/m |
| C & D | ☐ | ■ | ☐ | 130 | 1 | 300 | OK | μm |
| Corner | ☐ | ■ | ☐ | 75 | 65 | 90 | OK | n/a |
| Edge-1 | ☐ | ■ | ☐ | 0.6 | 0.1 | 0.4 | NG | m/m |
| Edge-2 | ☐ | ■ | ☐ | 0.5 | 0.1 | 0.4 | NG | m/m |

C & D : Crack and Defect on glass

ATM Glass Loader

Fig. 7

SUBSTRATE INSPECTION SYSTEM AND A METHOD OF USE THEREOF

CROSS-REFERENCE TO RELATED APPLICATIONS

This application is a continuation of U.S. application Ser. No. 17/656,343, filed Mar. 24, 2022, which is a continuation of U.S. application Ser. No. 17/305,838, filed Jul. 15, 2021, now U.S. Pat. No. 11,286,567, issued Mar. 29, 2022, which is a continuation of U.S. application Ser. No. 17/345,795, filed Jun. 11, 2021, which claims the benefit of U.S. Provisional Application No. 63/175,282, filed Apr. 15, 2021. Each of the aforementioned applications is incorporated by reference herein in its entirety, and each is hereby expressly made a part of this specification.

BACKGROUND

Technical Field

The present disclosure relates to a glass and wafer inspection system, and more particularly the present disclosure relates to a camera-based inspection system and a method for inspecting film deposition process for glass and wafers.

Description of Related Technology

Glasses and wafers referred to hereinafter as a substrate, are coated with a variety of coatings to enhance their mechanical, chemical, optical, electric, magnetic, or other properties. Typically, one or more thin films are deposited on the substrate by one of several known processes, such as chemical vapor deposition (CVD) which is a common process for depositing thin films on substrates.

SUMMARY

One aspect of the present disclosure provides a film deposition apparatus, which may comprise: a load lock chamber comprising a first door and a second door, the first door of the load lock chamber configured to receive a glass substrate from an outside of the film deposition apparatus, the load lock chamber configured to clamp the received glass substrate; a deposition chamber coupled to the second door of the load lock chamber, the deposition chamber configured to deposit a film over the glass substrate to form a film-deposited glass substrate, the deposition chamber further configured to receive the glass substrate from the load lock chamber and release the film-deposited glass substrate to the load lock chamber; a transfer chamber connected to the load lock chamber and the deposition chamber; a transfer robot disposed in the transfer chamber and configured to move the glass substrate between the load lock chamber and the deposition chamber; a plurality of cameras attached to an exterior of the load lock chamber to capture images of one or more corners of each of the glass substrate and the film-deposited glass substrate while the glass substrate and the film-deposited glass substrate are disposed inside the load lock chamber; and at least one controller configured to control operations of one or more of the load lock chamber, the deposition chamber, and the transfer robot, the at least one controller being further configured to: cause the plurality of cameras to capture a first set of images of the one or more corners of the glass substrate after the glass substrate is received from the outside of the film deposition apparatus by the load lock chamber, cause the plurality of cameras to capture a second set of images of the one or more corners of the glass substrate after the received glass substrate is clamped by the load lock chamber, cause the plurality of cameras to capture a third set of images of the one or more corners of the film-deposited glass substrate after the film-deposited glass substrate is released from the deposition chamber and received by the load lock chamber, cause the plurality of cameras to capture a fourth set of images of the one or more corners after the film-deposited glass substrate is clamped by the load lock chamber, analyze at least one of the first, second, third or fourth set of images to determine whether at least one of the glass substrate or the film-deposited glass substrate has a defect, and cause a display to display analysis results and the at least one of the first, second, third or fourth set of images.

In the foregoing apparatus, the plurality of cameras may comprise two or more cameras arranged at two or more corner areas of the load lock chamber, respectively, and configured to capture images of two or more corners of each of the glass substrate and the film-deposited glass substrate that are disposed below the two or more corner areas of the load lock chamber. The plurality of cameras may comprise four cameras arranged at four corner areas of the load lock chamber, respectively, and configured to capture images of four corners of each of the glass substrate and the film-deposited glass substrate that are disposed below the four corner areas of the load lock chamber.

Still in the foregoing apparatus, when analyzing the at least one of the first, second, third or fourth set of images, the at least one controller may be configured to: analyze edge lines of the deposited film in the third or fourth set of images of the one or more corners of the film-deposited glass substrate to evaluate status of parts in the deposition chamber. When analyzing the at least one of the first, second, third or fourth set of images, the at least one controller may be configured to: analyze reflectiveness and refractiveness of the deposited film in the third or fourth set of images of the one or more corners of the film-deposited glass substrate to evaluate operation of parts in the deposition chamber. When analyzing the at least one of the first, second, third or fourth set of images, the at least one controller may be configured to: analyze film corner profiles of the deposited film in the third or fourth set of images of the one or more corners of the film-deposited glass substrate to evaluate at least one of a status of a substrate fixture, sagging of an electrode, a flatness of susceptor, arc formation, or a gap between the electrode and the substrate fixture in the deposition chamber.

Further in the foregoing apparatus, when analyzing the at least one of the first, second, third or fourth set of images, the at least one controller may be configured to: compare the first set of images and the second set of images to evaluate an operation accuracy of a loading-unloading robot configured to load the glass substrate in the load lock chamber. When analyzing the at least one of the first, second, third and fourth sets of images, the at least one controller may be configured to: compare the third set of images and the fourth set of images to evaluate an operation accuracy of the transfer robot.

The foregoing apparatus may further comprise: a plurality of secondary cameras disposed on the outside of the load lock chamber and configured to scan the glass substrate being loaded to the load lock chamber by a loading-unloading robot, wherein the at least one controller is further configured to analyze images scanned by the plurality of secondary cameras to detect a defect of the glass substrate.

Another aspect of the present disclosure provides a film deposition apparatus, which may comprise: a load lock chamber comprising a first door and a second door, the first door of the load lock chamber configured to receive a glass substrate from an outside of the film deposition apparatus, the load lock chamber configured to clamp the received glass substrate; a deposition chamber coupled to the second door of the load lock chamber, the deposition chamber configured to deposit a film over the glass substrate to form a film-deposited glass substrate, the deposition chamber further configured to receive the glass substrate from the load lock chamber and release the film-deposited glass substrate to the load lock chamber; a transfer chamber connected to the load lock chamber and the deposition chamber; a transfer robot disposed in the transfer chamber and configured to move the glass substrate between the load lock chamber and the deposition chamber; a plurality of cameras attached to an exterior of the load lock chamber to capture images of one or more portions of each of the glass substrate and the film-deposited glass substrate while the glass substrate and the film-deposited glass substrate are disposed inside the load lock chamber; and at least one controller configured to control operations of one or more of the load lock chamber, the deposition chamber, and the transfer robot, the at least one controller being further configured to: cause the plurality of cameras to capture a first set of images of the one or more portions of the glass substrate after the glass substrate is received from the outside of the film deposition apparatus by the load lock chamber, cause the plurality of cameras to capture a second set of images of the one or more portions of the glass substrate after the received glass substrate is clamped by the load lock chamber, cause the plurality of cameras to capture a third set of images of the one or more portions of the film-deposited glass substrate after the film-deposited glass substrate is released from the deposition chamber and received by the load lock chamber, cause the plurality of cameras to capture a fourth set of images of the one or more portions after the film-deposited glass substrate is clamped by the load lock chamber, analyze at least one of the first, second, third or fourth set of images to determine whether at least one of the glass substrate or the film-deposited glass substrate has a defect, and cause a display to display analysis results and the at least one of the first, second, third or fourth set of images.

Still another aspect of the present disclosure provides a method of depositing a film on a glass substrate, which may comprise: providing a film deposition apparatus comprising: a load lock chamber configured to receive and clamp a glass substrate, a deposition chamber configured to deposit a film over the glass substrate to form a film-deposited glass substrate, a transfer chamber connected to the load lock chamber and the deposition chamber, a transfer robot disposed in the transfer chamber and configured to move the glass substrate and the film-deposited glass substrate between the load lock chamber and the deposition chamber, and a plurality of cameras attached to an exterior of the load lock chamber to capture images of one or more corners of each of the glass substrate and the film-deposited glass substrate; moving the glass substrate, using a loading-unloading robot, from an outside of the load lock chamber to an inside of the load lock chamber to place the glass substrate in the load lock chamber; upon placing the glass substrate, capturing, by the plurality of cameras, a first set of images of the one or more corners of the glass substrate; clamping the glass substrate loaded from the outside of the load lock chamber; upon clamping the glass substrate in the load lock chamber, capturing, by the plurality of cameras, a second set of images of the one or more corners of the glass substrate; moving the glass substrate, by the transfer robot in the transfer chamber, from the load lock chamber to the deposition chamber; depositing a film over the glass substrate in the deposition chamber to form the film-deposited glass substrate; moving the film-deposited glass substrate, by the transfer robot, from the deposition chamber to the load lock chamber to place the film-deposited glass substrate in the load lock chamber; upon placing the film-deposited glass substrate in the load lock chamber, capturing, by the plurality of the cameras, a third set of images of the one or more corners of the film-deposited glass substrate; clamping the film-deposited glass substrate in the load lock chamber; upon clamping the film-deposited glass substrate, capturing a fourth set of images of the one or more corners of the film-deposited glass substrate; unloading the film-deposited glass substrate, by the loading-unloading robot, from the load lock chamber; analyzing, by at least one controller, at least one of the first, second, third or fourth set of images to determine whether at least one of the glass substrate or the film-deposited glass substrate has a defect; and displaying the at least one of the first, second, third or fourth set of images and analyzing results on a display.

In the foregoing method, the glass substrate may have a rectangular shape, and the plurality of cameras may comprise four cameras arranged at four corner areas of the load lock chamber, respectively, and configured to capture images of four corners of the glass substrate and the film-deposited glass substrate that are disposed below the four corner areas of the load lock chamber.

Still in the foregoing method, the analyzing may comprise: analyzing edge lines of the deposited film in the third or fourth set of images of the one or more corners of the film-deposited glass substrate to evaluate status of parts in the deposition chamber. The analyzing may comprise: analyzing reflectiveness and refractiveness of the deposited film in the third or fourth set of images of the one or more corners of the film-deposited glass substrate to evaluate operation of parts in the deposition chamber. The analyzing may comprise: analyzing film corner profiles of the deposited film in the third or fourth set of images of the one or more corners of the film-deposited glass substrate to evaluate at least one of a status of a substrate fixture, sagging of an electrode, a flatness of susceptor, arc formation, or a gap between the electrode and the substrate fixture in the deposition chamber.

Further in the foregoing method, the analyzing may comprise: comparing the first set of images and the second set of images to evaluate an operation accuracy of the loading-unloading robot. The analyzing may comprise: comparing the third set of images and the fourth set of images to evaluate an operation accuracy of the transfer robot. The foregoing method may further comprise: scanning, by a plurality of secondary cameras disposed outside the load lock chamber, the glass substrate being loaded to the load lock chamber by the loading-unloading robot to detect a defect of the glass substrate.

A further aspect of the present disclosure provide a non-transitory storage medium storing instructions therein, wherein when executed by the at least one controller of the foregoing film deposition apparatus, the instructions may cause the at least one controller to: cause the plurality of cameras to capture a first set of images of the one or more corners of the glass substrate after the glass substrate is received from the outside of the film deposition apparatus by the load lock chamber, cause the plurality of cameras to capture a second set of images of the one or more corners of the glass substrate after the received glass substrate is clamped by the load lock chamber, cause the plurality of cameras to capture a third set of images of the one or more corners of the film-deposited glass substrate after the film-deposited glass substrate is released from the deposition chamber and received by the load lock chamber, cause the plurality of cameras to capture a fourth set of images of the one or more corners after the film-deposited glass substrate is clamped by the load lock chamber, analyze at least one of the first, second, third or fourth set of images to determine whether at least one of the glass substrate or the film-deposited glass substrate has a defect, and cause a display to display analysis results and the at least one of the first, second, third or fourth set of images.

The following presents a simplified summary of one or more embodiments of the present disclosure in order to provide a basic understanding of such embodiments. This summary is not an extensive overview of all contemplated embodiments and is intended to neither identify key or critical elements of all embodiments nor delineate the scope of any or all embodiments. Its sole purpose is to present some concepts of one or more embodiments in a simplified form as a prelude to the more detailed description that is presented later.

Another aspect of the present disclosure is directed to an inspection system.

It is another aspect of the present disclosure that the inspection system can recognize the glass location in a process chamber apparatus.

It is still another aspect of the present disclosure that the inspection system can recognize the fixture status on the substrate.

It is yet another aspect of the present disclosure that the inspection system can recognize the sagging of big size electrodes in the process chamber apparatus.

It is still another aspect of the present disclosure that the inspection system can detect substrate breakage, crack, stain, or spot.

It is a further aspect of the present disclosure that the inspection system can detect transfer robot performance with glass position data.

In one aspect, disclosed is a method of inspection and an inspection system for film deposition process for substrates includes glass and wafer. The inspection system includes multiple cameras positioned in a load lock unit of the deposition chamber, such as the cameras can capture the substrate in the load lock.

In one aspect, the cameras are coupled to a control unit, wherein the control unit is configured to analyze the images obtained from the camera for defects in the deposition process and the process itself including breakage, crack, stain or spot, transfer robot performance with glass position data, fixture alignment status with analysis of film edge line, and electrode sagging with film analysis of corner area.

In one aspect, disclosed is a method for analyzing the film with different reflectiveness and refractiveness of induced light in the camera module.

In one aspect, disclosed is a method for corner film profile analysis that can check susceptor/electrode flatness, arc generation, and the assembling status of substrate fixtures (S/F).

In one aspect, disclosed is a method for evaluating the accuracy and precision of the transfer robot in the substrate loading and unloading.

These and other aspects, features and advantages of the embodiments herein and the summary will become readily apparent from the following detailed description taken in conjunction with the accompanying drawings.

BRIEF DESCRIPTION OF THE DRAWINGS

The accompanying figures, which are incorporated herein, form part of the specification and illustrate embodiments of the present disclosure. Together with the description, the figures further explain the principles of the present disclosure and to enable a person skilled in the relevant arts to make and use the disclosure.

FIG. 7 shows the interface provided by the control unit on the display, according to an example embodiment of the present disclosure.

DETAILED DESCRIPTION

Figure 1:
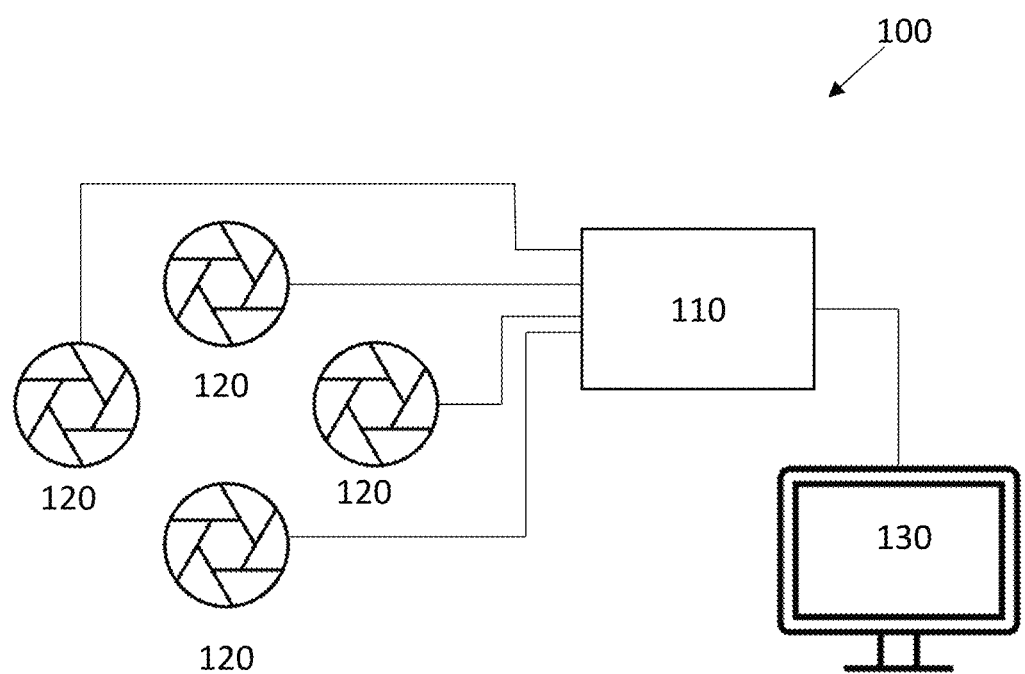
FIG. 1 is a block diagram showing the disclosed inspection system, according to an example embodiment of the present disclosure.

A film deposition process can be conducted in special chambers, such as plasma enhanced CVD (PECVD) or physical vapor deposition (PVD) chambers. Robots can be used to handle the glass in and out of the chambers without any human intervention. The deposition process is generally monitored or inspected for any defects, such as chipping, break, spot/stain etc., which can be detected with known vision systems. Currently known inspection methods have several limitations. The deposition process is prone to several kinds of defects which cannot be detected by known inspection systems. Moreover, the known inspection systems cannot recognize the substrate location in the process chamber apparatus and a lot of other process parameters. There currently exists an industry need for an inspection system that can detect defects in both the substrate processing and the processing parameters.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, the subject matter may be embodied as methods, devices, components, or systems. The following detailed description is, therefore, not intended to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the term "embodiments of the present disclosure" does not require that all embodiments of the disclosure include the discussed feature, advantage, or mode of operation.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description discusses example embodiments of the disclosure. The description is not to be taken in a limiting sense but is made merely for the purpose of illustrating the general principles of the disclosure, since the scope of the disclosure will be defined by the allowed claims of any resulting patent.

FIG. 1 discloses an inspection system that can be used for monitoring the thin film deposition process in a deposition chamber for substrates including glass and wafer. The inspection system 100 can include a control unit or controller 110 that can be connected to several camera modules 120 that can be installed in the substrate load lock unit of the process chamber apparatus, also referred to hereinafter as a load lock. The control unit can control the camera modules 120. For example, the control unit 110 of the inspection system 100 can be connected to the control unit of the process chamber apparatus 200 to detect steps of the operation, such as glass loading, and based on the input from the process chamber apparatus 200 can control the activation of camera modules. The control unit 110 can also be connected to a display 130, wherein the control unit 110 can provide an interface on the display 130 graphically presenting different parameters of the inspection and the identified values of the parameters.

Figure 2:
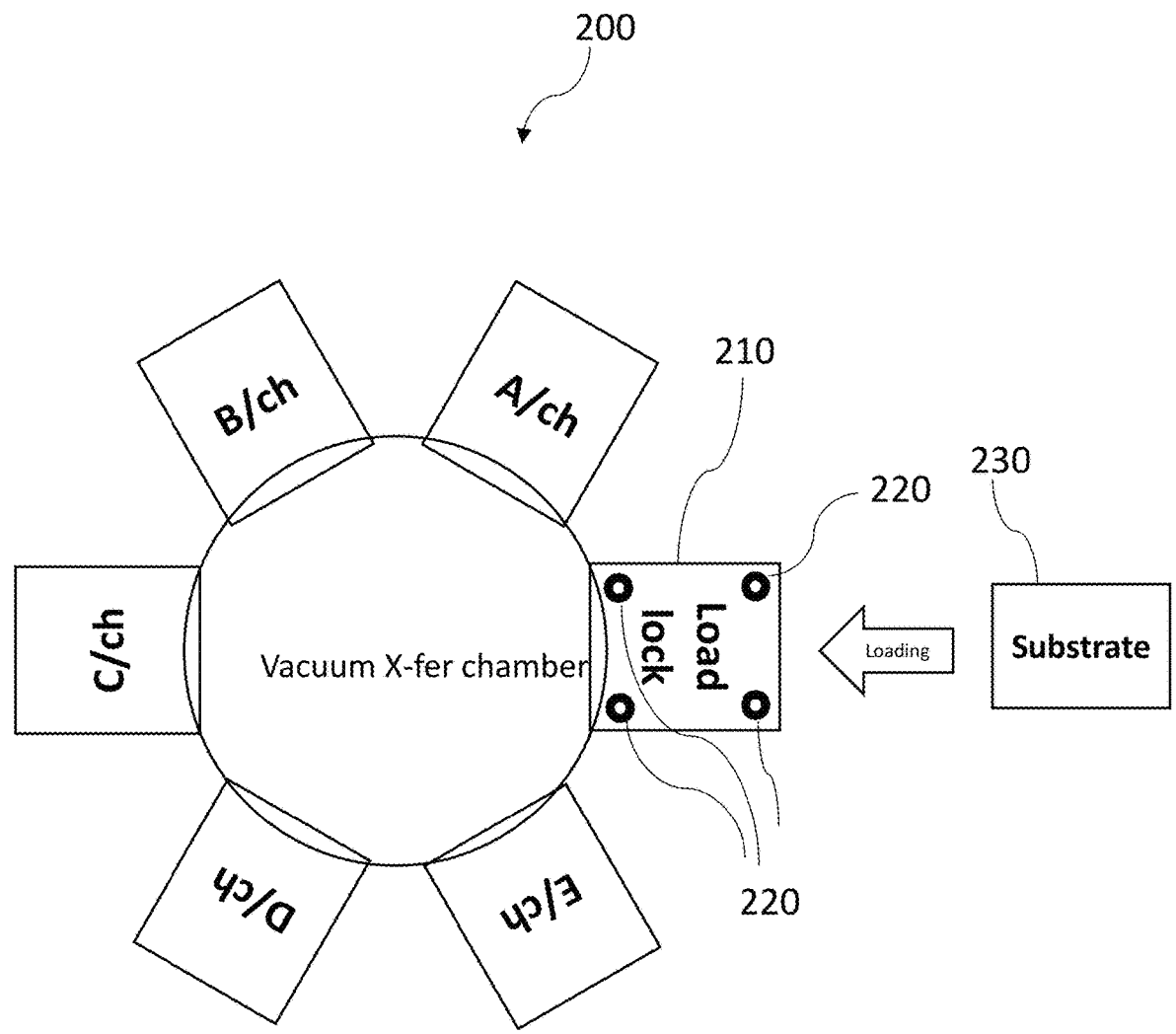
FIG. 2 shows an example embodiment of the arrangement of camera modules of the inspection system, according to an example embodiment of the present disclosure.

Referring to FIG. 2 which shows an example embodiment of the process chamber apparatus 200 for thin film deposition or coating on a substrate, such as glass or wafer. The process chamber apparatus 200 can have a substrate load lock unit or chamber that can receive the substrate 230. FIG. 2 shows the substrate load lock unit 210 as a part of the process chamber apparatus 200. The substrate load lock unit 210 can have a front door to receive substrate 230. Another door separates the processing modules from the load lock 210. Robotic arms having substrate fixtures can move the substrate into and from the substrate load lock unit 210. The substrate is generally not directly introduced in the process modules but the load lock. The process modules are the vacuum chambers in which the deposition processes like sputtering, electron beam evaporation, or thermal evaporation take place. Load locks are secondary vacuum chambers that are connected to a process module, separated by a gate valve, and have their own high vacuum pump down and vent control.

The camera modules 220 can be positioned in or adjacent to the load locks to capture the handling and status of the substrate before and after the processing. FIG. 2 shows four camera modules 220 mounted to the load lock 210 for capturing images of the substrate in the load lock 210. All the four camera modules 220 can be in electrical communication with the control unit 110. It is to understand that FIG. 2 shows four camera modules, however, two or more camera modules are within the scope of the present disclosure.

Figure 3:
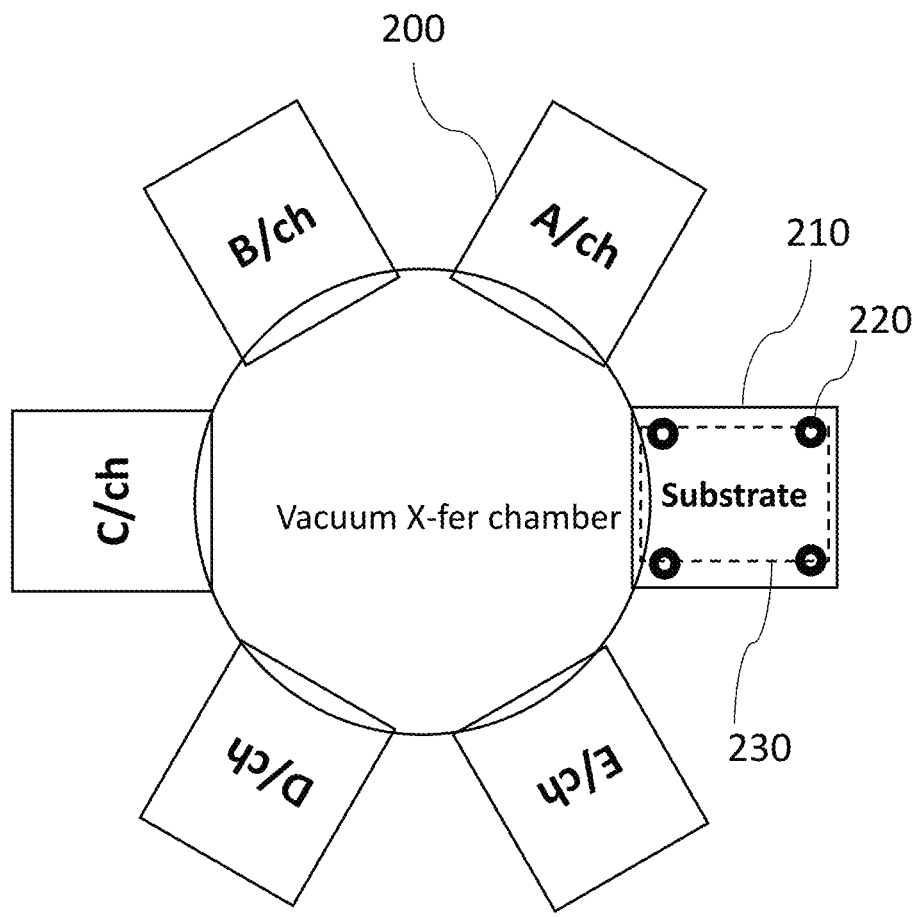
FIG. 3 shows the substrate loaded in a substrate loading chamber, according to an example embodiment of the present disclosure.
Figure 4:
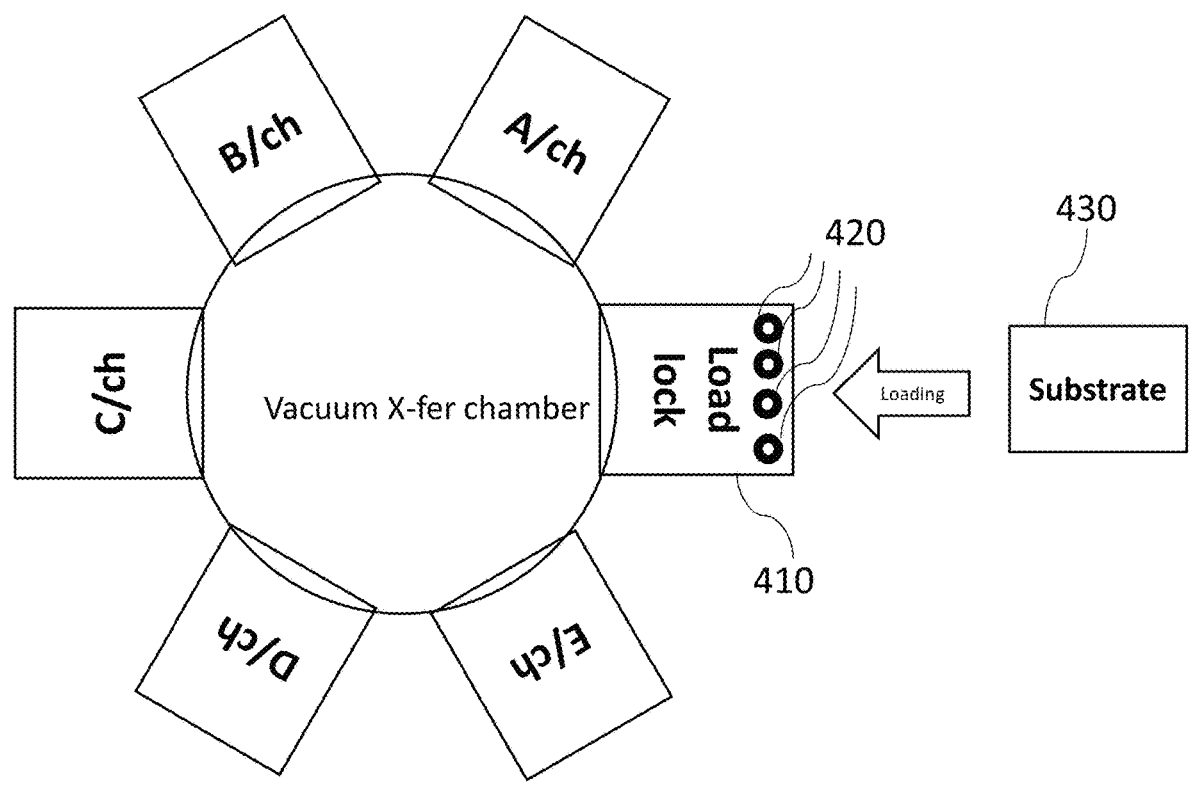
FIG. 4 shows a different arrangement of the camera modules of the inspection system, according to an example embodiment of the present disclosure.
Figure 5:
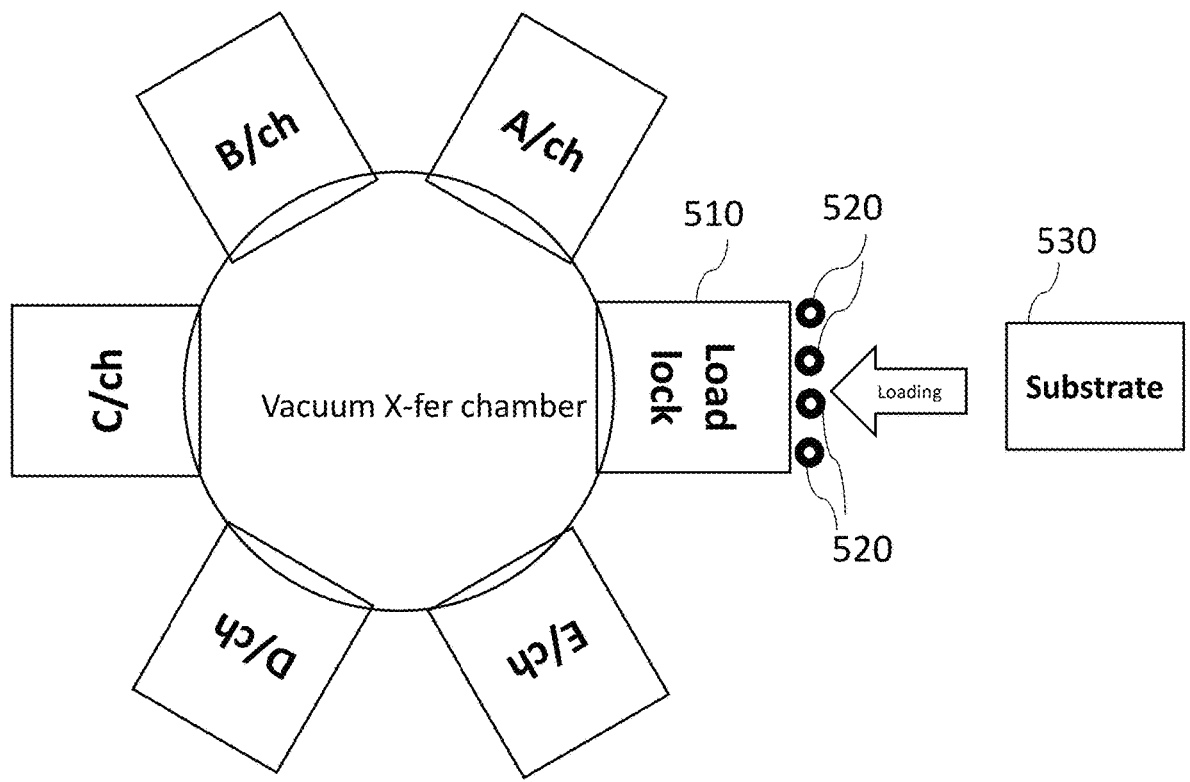
FIG. 5 shows yet another arrangement of the camera modules of the inspection system, according to an example embodiment of the present disclosure.

A robot can transfer a new substrate 230 into the load lock 210, the first door of the load lock 210 can be opened to receive the substrate into the load lock 210. Typically, the robot can extend the arm to deliver the substrate 230 into the load lock 210 and lowers the substrate onto support pins in the load lock 210 and the arm can then be retracted. Upon receiving the substrate and removal of the arm, the first door can be closed. Thereafter, the load lock 210 tries to pump down to get the base vacuum level, which generally takes about 20 or 30 secs. During the pumping down in the glass loading chamber, the control unit 110 can trigger the four camera modules 220 to capture images of the substrate in the load lock 210. The images can be analyzed for the position of the substrate in the load lock 210. FIG. 3 shows the substrate 230 in the load lock 210 and the position of the four camera modules 220 can be relative to the substrate 230. The arrangement of the camera modules in the load lock 210 and relative to the substrate 230 can be changed without departing from the scope of the present disclosure. For example, FIG. 4 shows the four camera modules 420 linearly arranged at the entrance of the load lock 410 and relative to the substrate 430. An alternative embodiment of the arrangement of the four camera modules can be seen in FIG. 5 wherein the four camera modules 520 are still arranged linearly but positioned differently near the entrance of the load lock 510 and relative to the substrate 530. The arrangement of the four camera modules as shown in FIG. 2 can be a preferred embodiment, however, a skilled person will appreciate that the position and arrangement of the four camera modules can be optimized based on the process parameters.

Figure 6:
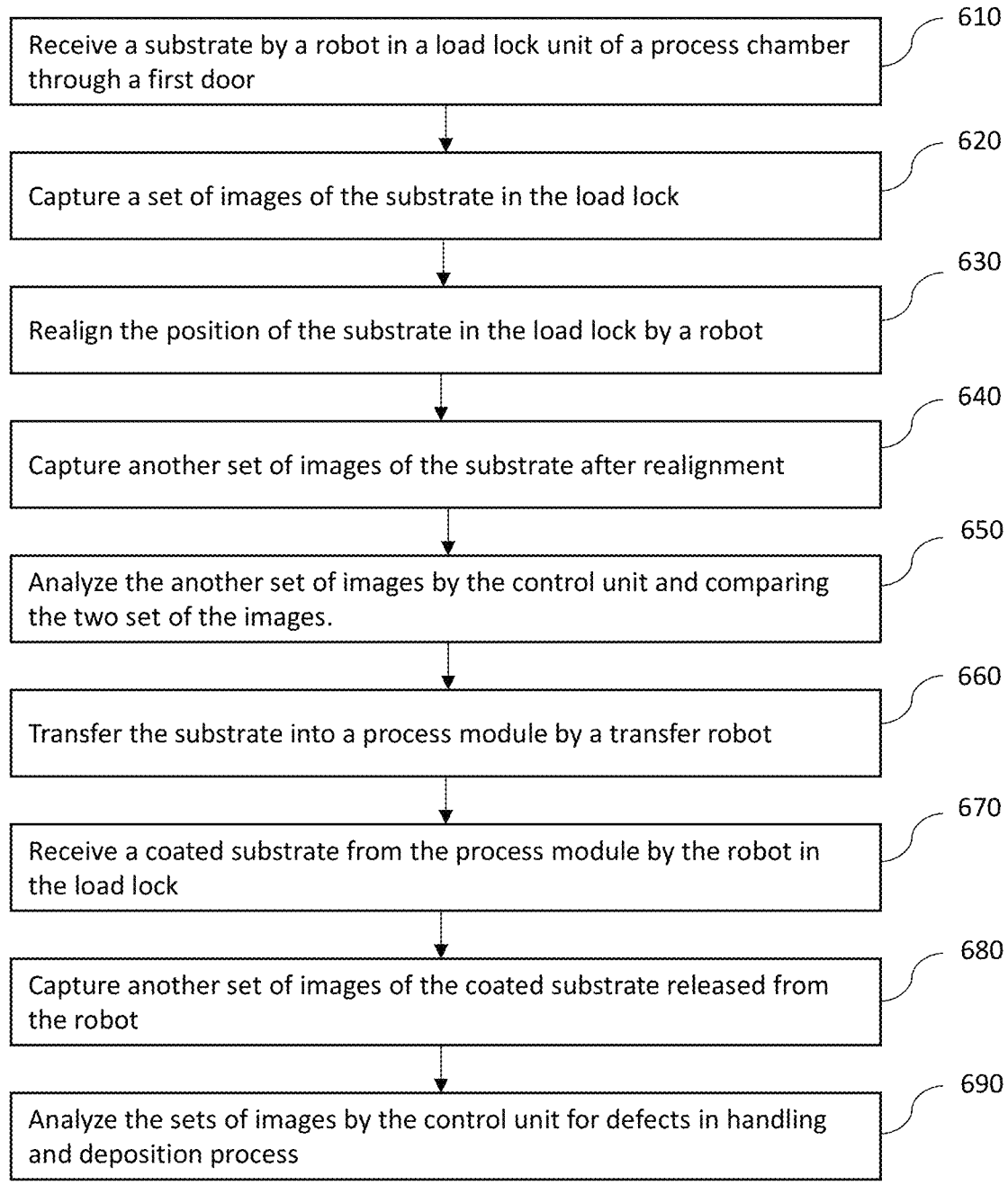
FIG. 6 is a flow chart showing the disclosed method of inspecting the substrate coating process, according to an example embodiment of the present disclosure.

FIG. 6 is a flow chart showing an example embodiment of the method of monitoring the substrate coating process in a process chamber apparatus. First, a substrate can be received by a robot in a substrate load lock unit of the process chamber apparatus, at step 610. The robot can release the substrate in the load lock on support pins and get retracted from the load lock. The control unit can trigger the camera modules to capture the images of the substrate in the load lock rested on the support pins, at step 620. Images captured at this stage can be useful in determining the accuracy and precision of the robot in handling the substrate. A robot typically handles the substrate four times in the load lock i.e., receiving the substrate, transferring the substrate to the process modules, receiving from the process modules, and transferring outside the process chamber apparatus. Clamping of the substrate by the robot can also damage the substrate or coating on the substrate. The images captured at step 620 can also be used to track the defects in the substrate caused by clamping. The image can be received by the control unit and using the predefined rules, the control unit can analyze the images to detect inspect any damage, scratch, stain on the substrate. The position of the substrate in the load lock can also be used to check the accuracy of the robot and do any calibrations if needed.

In the next stage, the robot can realign the position of the substrate in the load lock if required by shifting or sliding the substrate within the load lock, at step 630. The new position of the substrate after realignment by the robot can be captured by the camera modules, at step 640. The images captured at step 640 can be analyzed to measure the displacement of the substrate and detect any defect resulted from the clamping, at step 650. The analysis can be made by comparing the images captured at step 640 with the images captures at step 620. After receiving the substrate at step 610, the load lock generally pumps the air to create a vacuum. Upon completion of the pumping, the door of the transfer chamber side can be open, and the transfer chamber robot arm can pick the substrate for transferring to the process modules, at step 660. The film deposition process can be carried out in the process modules. Once the deposition process is complete, the substrate can be moved to the load lock, at step 670. The transfer robot can deliver the substrate in the load lock and retract. In the load lock, the camera modules 220 can take another set of images of the substrate, at step 680. This set of images can be used to analyze the accuracy of the transfer robot in positioning the substrate in the load lock, at step 690. Moreover, the set of images can also be analyzed to inspect the substrate for scratches, cracks, or abnormal plasma. Any displacement of the substrate by the robot can again be inspected using another set of images captured. After clamping, another set of images can be captured by the camera modules. Comparing the image set after clamping with the image set just before clamping can reveal any errors in the handling, such as any crack or scratch by clamping. The analysis can be done by the control unit which can receive the set of the images captures by the camera modules.

The final set of images captured of the coated substrate i.e., after the film deposition process, the set of images can be analyzed by the control unit for any defects in the deposition process. For example, the control unit can analyze the film condition at the corner areas. If there is a gap between the electrode of the ground side and the glass fixture, there may be an unclear edge line and different film densities at the corner area. The control unit can be equipped with suitable algorithms to detect the susceptor/electrode flatness, Arc generation, assembling status of substrate fixture (S/F) using the corner film profile. The control unit can further analyze substrate fixture sitting status and the robot's accuracy and precision at different stages in handling the substrate.

Referring to FIG. 7, the control unit 110 can be connected to a suitable display and an interface can be provided by the control unit on the display for monitoring the status of the substrate before and after the deposition process. The interface can be an interactive interface that may allow a user to interact with the system to determine and inspect different parameters, defining thresholds. The interface can include multiple frames for displaying the images. FIG. 7 shows four frames that can show the processed images of the upper left, upper right, lower left, and the lower right of the substrate. On the right side can be seen different parameters for the substrate. Thresholds including the min and max can be provided for desired parameters. The user can see the parameters for either upper left, upper right, lower left, and the lower right, wherein clickable tabs can be provided to switch between windows presenting the parameters for the upper left, upper right, lower left, and the lower right. FIG. 7 shows the clickable tabs in the upper right position.

Figure 8:
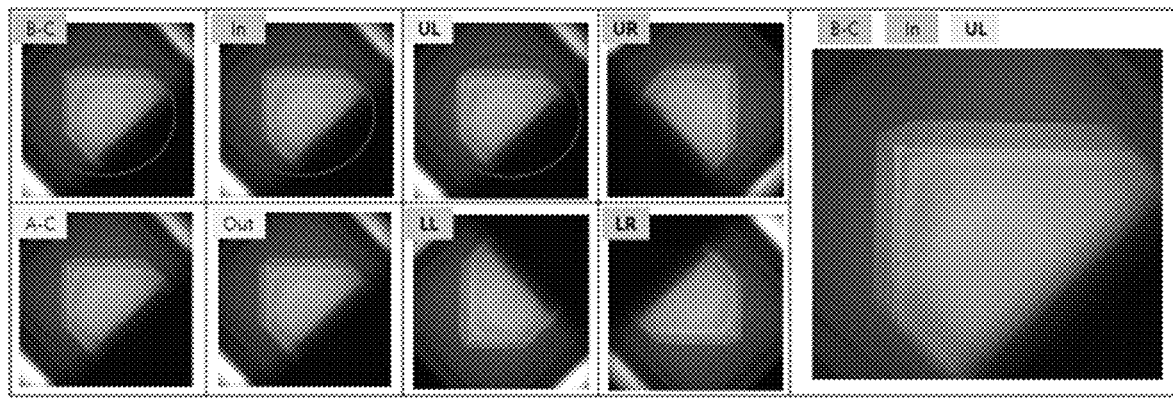
FIG. 8 shows an example embodiment of the interface having a frame for images, according to an example embodiment of the present disclosure.
Figure 9:
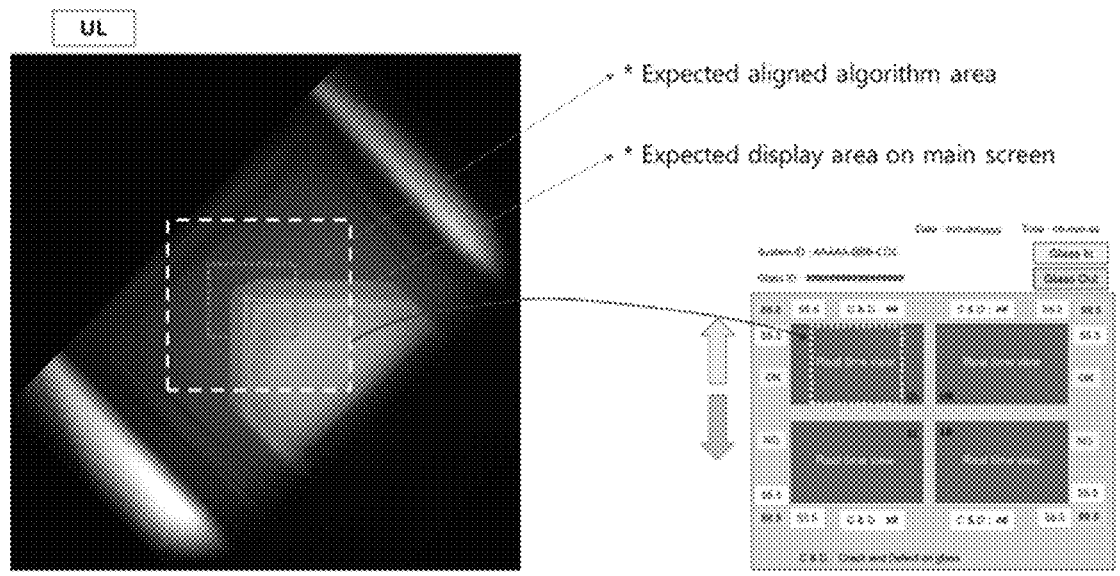
FIG. 9 shows an image for corner profile analysis and the frame view of the image as displayed on the interface of FIG. 6, according to an example embodiment of the present disclosure.
Figure 10:
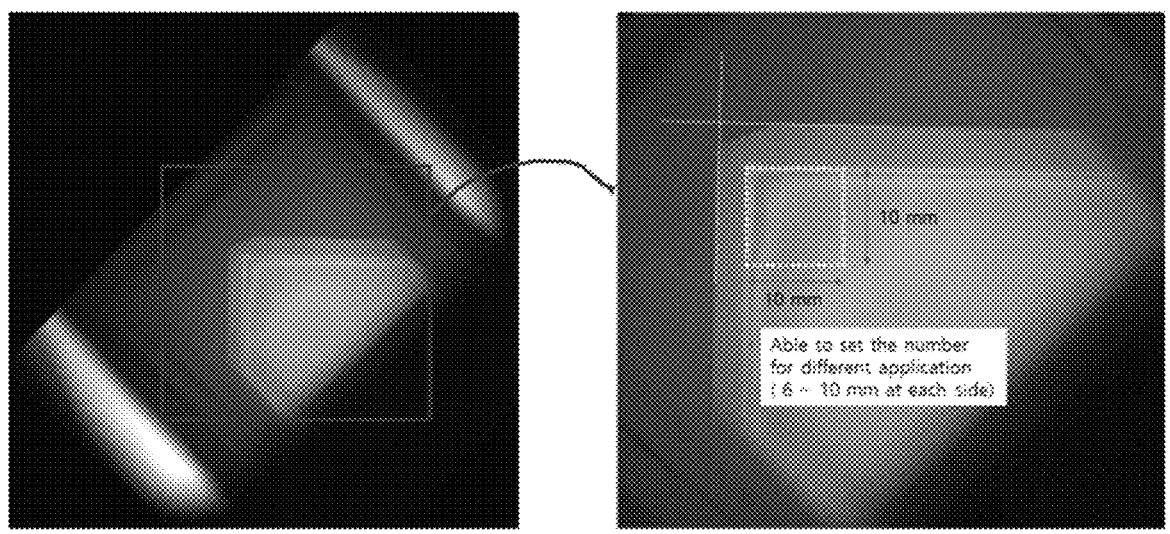
FIG. 10 shows an example embodiment of analyzing an image for corner analysis profile, according to an example embodiment of the present disclosure.

FIG. 8 shows the set of images captured for the corner profile analysis. The interface can provide options to view the image set of desired time duration and stage of different process modules. The user can navigate through the list and select an entry to view the images and related parameters. FIG. 9 illustrates how the control unit can process the image using the predefined rules and algorithms and display a section of the image in the frame of the main interface shown in FIG. 7. FIG. 10 shows how to set thresholds for the corner profile analysis.

While the foregoing written description of the disclosure enables one of ordinary skill to make and use embodiments, those of ordinary skill will understand and appreciate the existence of variations, combinations, and equivalents of the embodiments, method, and examples herein. The disclosure should therefore not be limited by the above-described embodiment, method, and examples, but by all embodiments and methods within the scope and spirit of the disclosure as claimed.

What is claimed is:

1. A method of inspecting a substrate, the method comprising:
   causing, at a controller, one or more cameras to capture at least one first image of one or more portions of a substrate disposed inside a load lock chamber of a film deposition apparatus after the substrate is received from an outside of the film deposition apparatus and before the substrate is clamped by the load lock chamber;
   causing, at the controller, the one or more cameras to capture at least one second image of the one or more portions of the substrate disposed inside the load lock chamber after the substrate is clamped by the load lock chamber and while the substrate remains clamped by the load lock chamber;
   analyzing either or both of the at least one first image or the at least one second image to determine a displacement of the substrate with respect to a reference position in the load lock chamber;
   causing, at the controller, the one or more cameras to capture at least one third image of one or more portions of a film-deposited substrate placed in the load lock chamber after the film-deposited substrate is received from a deposition chamber of the film deposition apparatus;
   analyzing, at the controller, the at least one third image to determine whether a film on the film-deposited substrate has a defect or an error; and
   displaying analysis results on a display,
   wherein analyzing the at least one third image comprises:
      analyzing edge lines and corner profiles of a deposited film in the at least one third image of the one or more portions of the film-deposited substrate, and
      determining a status of at least one of parts in the deposition chamber, the status comprising an assembling status of a substrate fixture, sagging of an electrode, a flatness of susceptor or electrode, arc formation, or a gap between the electrode and the substrate fixture in the deposition chamber based on analysis of the edge lines and corner profiles of the deposited film, and
   wherein the analysis results being displayed on the display comprise information on at least one of the corner profiles.

2. The method of claim 1, further comprising:
   causing, at the controller, the one or more cameras to capture at least one fourth image of the one or more portions of the film-deposited substrate disposed inside the load lock chamber after the film-deposited substrate is clamped by the load lock chamber; and analyzing either or both of the at least one third image or the at least one fourth image to determine a displacement of the substrate with respect to the reference position in the load lock chamber, wherein the at least one third image is captured before the film-deposited substrate is clamped by the load lock chamber, and the at least one fourth image is captured while the film-deposited substrate remains clamped by the load lock chamber to evaluate an operation accuracy of a transfer robot configured to transfer the substrate or the film-deposited substrate between the load lock chamber and the deposition chamber.

3. The method of claim 1, further comprising:

analyzing reflectiveness and refractiveness of the deposited film in the at least one third image of the one or more portions of the film-deposited substrate; and evaluating operation of the at least one of parts in the deposition chamber based on analysis of the reflectiveness and the refractiveness of the deposited film.

* * * * *